(12) United States Patent
Katou

(10) Patent No.: US 10,204,760 B2
(45) Date of Patent: Feb. 12, 2019

(54) CHARGED PARTICLE BEAM APPARATUS

(71) Applicant: Hitachi High-Technologies Corporation, Minato-ku, Tokyo (JP)

(72) Inventor: Tatsuichi Katou, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 302 days.

(21) Appl. No.: 15/163,025

(22) Filed: May 24, 2016

(65) Prior Publication Data

US 2016/0358745 A1 Dec. 8, 2016

(30) Foreign Application Priority Data

Jun. 4, 2015 (JP) .................................. 2015-113759

(51) Int. Cl.
*H01J 37/22* (2006.01)
*H01J 37/28* (2006.01)
*G06T 7/00* (2017.01)

(52) U.S. Cl.
CPC .......... *H01J 37/222* (2013.01); *G06T 7/0004* (2013.01); *H01J 37/28* (2013.01); *G06T 2207/10061* (2013.01); *G06T 2207/20016* (2013.01); *G06T 2207/20224* (2013.01); *G06T 2207/30148* (2013.01); *H01J 2237/2817* (2013.01)

(58) Field of Classification Search
None
See application file for complete search history.

(56) References Cited

U.S. PATENT DOCUMENTS

| 2005/0045821 A1* | 3/2005 | Noji ..................... G01N 23/225 250/311 |
| 2007/0288219 A1* | 12/2007 | Zafar ........................ G03F 1/84 703/14 |
| 2014/0219546 A1 | 8/2014 | Minekawa et al. |
| 2015/0279614 A1 | 10/2015 | Hirai et al. |

FOREIGN PATENT DOCUMENTS

| JP | 4-65058 A | 3/1992 |
| JP | 2007-248360 A | 9/2007 |
| JP | 2013-69951 A | 4/2013 |
| JP | 2014-82326 A | 5/2014 |

OTHER PUBLICATIONS

Japanese-language Office Action issued in counterpart Japanese Application No. 2015-113759 dated Apr. 26, 2016 (5 pages).

* cited by examiner

*Primary Examiner* — Eileen M Adams
(74) *Attorney, Agent, or Firm* — Crowell & Moring LLP

(57) ABSTRACT

There is provided a charged particle beam apparatus which can quickly perform high accuracy positioning and defect detection. A process of acquiring a low magnification defect image for one defect candidate and a process of specifying a region appearing as a defect are performed by repeatedly performing a defect detection process maximum n-times and by using an integrated frame image of the low magnification defect image having at least one frame or the maximum n-number of frames for one defect candidate. As the low magnification defect image used in order to generate a difference image with a low magnification reference image for one defect candidate, the integrated frame image is used which is obtained by adding the frames of the low magnification defect image having at least one frame or the maximum n-number of frames.

10 Claims, 8 Drawing Sheets

X、Y:1024pixel

401

403

402

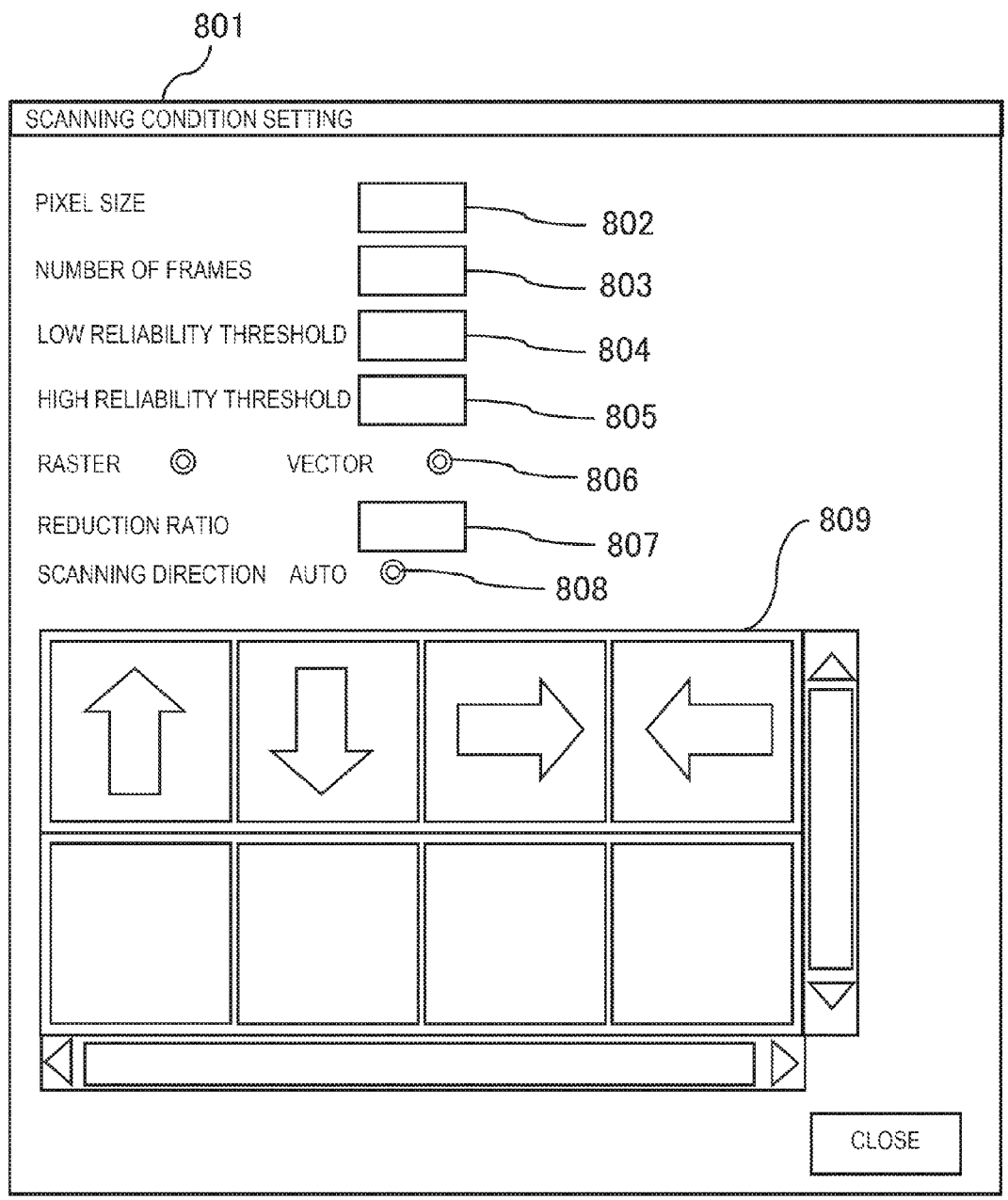

CHARGED PARTICLE BEAM APPARATUS

CLAIM OF PRIORITY

The present application claims priority from Japanese patent application JP 2015-113759 filed on Jun. 4, 2015, the content of which is hereby incorporated by reference into this application.

TECHNICAL FIELD

The present invention relates to a charged particle beam apparatus which images a site appearing as a defect on a sample by using a charged particle beam, and which detects a genuine defect from the captured image.
Background Art As an example of this charged particle beam apparatus, a defect observation apparatus is known such as a defect review SEM (DR-SEM) using a scanning electron microscope (SEM).

The defect observation apparatus automatically images a region appearing as a defect by using a charged particle beam in a high resolution manner, based on position information of a defect candidate on a sample which is obtained by a result of a sample inspection using an optical-type or electron beam-type defect inspection apparatus in advance. The defect observation apparatus determines whether or not the defect is a genuine defect, from a high magnification defect image in the region appearing as the defect, and specifies a position of the genuine defect. The defect observation apparatus automatically not only observes a shape of the defect, but also classifies the defect. For example, if the defect observation apparatus is applied to observation of a semiconductor wafer, the defect observation apparatus can automatically detect the defect which is generated during a semiconductor fabrication process and which is scattered at unspecified coordinate positions on a wafer. With regard to each detected defect, the defect observation apparatus also classifies the defect such as abnormal pattern formation.

In order for the defect observation apparatus to image the region appearing as the defect on the sample in a high resolution manner, a defect candidate to be observed is first sampled from all defect candidates scattered at unspecified coordinate positions on the sample, based on an inspection result of the defect inspection apparatus. Position information of each sampled defect candidate on the sample is acquired. Then, if the sample is placed on a stage on a coordinate system relating to stage movement of the defect observation apparatus in order to accurately recognize the coordinate position on the sample, the defect observation apparatus performs pattern matching between an alignment pattern located in a specific site on the sample and a template image for global alignment. The defect observation apparatus corrects a position deviation amount or a rotation deviation amount in a state where the sample is placed at the coordinate position on the sample on the stage. In this manner, in a case where the defect observation apparatus moves the stage, based on the position information of the defect candidate on the sample, the sampled defect candidate is captured in an imaging visual field of a scanning electron microscope.

Thereafter, based on a recipe in which an image acquisition condition (image capturing condition) is set in advance, the defect observation apparatus causes the scanning electron microscope to set the image acquisition condition using low magnification for each sampled defect candidate, and scans the defect candidate with a primary electron beam (electron beam). The defect observation apparatus captures a low magnification image (low magnification defect image) of the defect candidate, and captures a reference image using low magnification (low magnification reference image) for comparison with the defect candidate. Then, the defect observation apparatus generates a difference image between the low magnification defect image and the low magnification reference image which are obtained by capturing, and specifies an accurate coordinate position of a site having a difference between both images which appears on the difference image. Subsequently, the defect observation apparatus at this moment causes the scanning electron microscope to switch setting of the image acquisition condition to a high magnification image acquisition condition which enables a user to easily determine whether or not the site having the difference is a genuine defect. Based on the specified coordinate position, the defect observation apparatus scans the defect with the electron beam, and captures a high magnification image (high magnification defect image) of the region appearing as the defect of the defect candidate.

The defect observation apparatus performs a process of automatically recognizing the defect (automatic defect review: ADR), that is, a process of collecting the high magnification defect image of the region appearing as the defect for each defect candidate, based on the accurate coordinate position of the site having the difference appearing on the difference image between the low magnification defect image and the low magnification reference image. Through the process, the defect observation apparatus determines whether the defect candidate is a genuine defect or a false candidate. At the same time, based on the high magnification defect image of the defect which is obtained through ADR, the defect observation apparatus performs a process of automatically classifying the defect (automatic defect classification: ADC) so as to classify the defect in a diversified manner based on a shape and the like.

With regard to the defect observation apparatus serving as an example of this charged particle beam apparatus, PTL 1 discloses the following. The image acquisition condition of the low magnification image of the defect candidate is properly selected from multiple image acquisition conditions corresponding to a size of the defect candidate. The low magnification image (low magnification defect image) of the defect candidate is captured. Until defect detection accuracy of the site having the difference between both images which appears on the difference image with the reference image satisfies a completion determination condition, the image acquisition condition is switched and changed. An imaging process of the low magnification defect image and a completion determination process of the defect detection accuracy are repeatedly performed so as to shorten a time for acquiring the defect image.

In addition, PTL 2 discloses the following. The defect observation apparatus employs two types of electron beam emitting conditions in which current values are different between a low magnification (low accuracy) electron beam and a high magnification (high accuracy) electron beam. First, for each defect candidate, the defect observation apparatus performs low accuracy imaging under the emitting condition having the great current value of the electron beam, based on low accuracy defect position information obtained by the result of sample inspection using the defect inspection apparatus. After acquiring high accuracy defect position information of the defect candidate, the defect observation apparatus performs high accuracy imaging under the emitting condition having the small current value of the electron beam, based on the high accuracy defect position information.

CITATION LIST

Patent Literature

PTL 1: JP-A-2013-069951
PTL 2: JP-A-2007-248360

SUMMARY OF INVENTION

Technical Problem

However, according to the method of employing the image acquisition conditions corresponding to the size of the defect, which is disclosed in PTL 1, the result of the sample inspection using the defect inspection apparatus is inaccurate. Consequently, before the low magnification defect image is captured, it is not possible to determine in advance which image acquisition condition is to be employed. While the image acquisition conditions are sequentially switched over from a case having a large defect region toward a case having a small defect region, the low magnification defect image is repeatedly captured for the same defect candidate until the defect detection accuracy satisfies the completion determination condition. In addition, the defect inspection apparatus captures the low magnification defect image for detecting the defect, and concurrently, determines whether or not the defect detection accuracy satisfies the completion determination condition. However, during the repeated process, the defect inspection apparatus does not update a visual field center coordinate of the site appearing as the defect so as to reduce an imaging region around the updated coordinate. Consequently, the maximum time required for the imaging process of the low magnification defect image and the defect detection process is the same as that in the related art.

On the other hand, according to the method of employing two types of electron beam conditions in which the current values are different between the low magnification electron beam and the high magnification electron beam, which is disclosed in PTL 2, the method is effective in order to shorten the imaging time of the low magnification defect image by reducing the number of imaging frames (number of integrated image frames). In general, if a probe current increases approximately twice, even when the number of imaging frames decreases to approximately half of the number, it is known that the captured image having an equivalent or slightly smaller S/N ratio can be obtained. However, if a current value of the electron beam, that is, the probe current increases, resolution of the captured image becomes poor, thereby causing a possibility of poor accuracy in detecting a minor defect in the low magnification defect image. In addition, when the high magnification defect image is acquired, an electronic optical system condition of the probe current or the image acquisition condition has to be changed for imaging. Consequently, the method disclosed in PTL 2 does not considerably contribute to improved throughput of ADR.

The present invention is made in order to solve the above-described problems, and aims to provide a charged particle beam apparatus which can quickly perform high accuracy positioning and defect detection.

Solution to Problem

The present invention relates to a charged particle beam apparatus which captures an image of a site appearing as a defect on a sample, and detects a genuine defect from the captured image. While the site appearing as the defect on the sample is imaged, and concurrently, a defect detection process based on an integrated frame image obtained by imaging the site appearing as the defect on the sample is performed, an image acquisition condition of the site appearing as the defect on the sample is switched to an image acquisition condition including the number of integrated image frames.

Furthermore, a visual field central coordinate in an imaging region is updated corresponding to accuracy of defect detection using the defect detection process. The number of the integrated image frames is decreased, and/or the imaging region is reduced, and imaging after a mode is further switched to a high magnification mode is omitted. In this manner, a quickened inspection sequence is realized.

According to the present invention, when the low magnification defect image of the site appearing as the defect on the sample is captured using low magnification, image processing for detecting the defect is concurrently performed. In this manner, as the number of the integrated image frames of the integrated frame image increases, an S/N ratio is improved, thereby improving the defect detection accuracy. Accordingly, the site appearing as the defect can be accurately specified. Furthermore, according to the present invention, the imaging time is shortened by gradationally reducing the region which can be specified as the site appearing as the defect on the sample.

In addition, according to the present invention, the image processing in detecting the defect also improves information accuracy such as a shape of the defect, if the accuracy is compared with the inspection result. Accordingly, a vector scanning method is employed so as to further improve the defect detection accuracy by switching the condition to an optimal scanning condition, thereby further shortening the imaging time.

Advantageous Effects of Invention

According to the present invention, in the middle of a defect detection process, it is possible to decrease the number of integrated image frames of an integrated frame image of a site appearing as a defect on a sample.

In addition, according to the present invention, an imaging region is reduced. In this manner, it can be expected that a processing time in a defect detection sequence is shortened.

Furthermore, a vector scanning method is employed. In this manner, optimal scanning can be performed corresponding to a shape of the site appearing as the defect. Accordingly, the defect detection accuracy is improved, thereby providing an advantageous effect that the imaging time can be further shortened.

An object, configuration, and advantageous effect in addition to those described above will become apparent from description of the following embodiment.

BRIEF DESCRIPTION OF DRAWINGS

FIG. 8 illustrates a setting screen of a scanning condition in the charged particle beam apparatus according to the present embodiment.

Hereinafter, with regard to a charged particle beam apparatus according to the present invention, an example of a defect review SEM of a defect observation apparatus will be described with reference to the drawings. Without being limited to the defect review SEM, the charged particle beam apparatus according to the present invention may be any charged particle beam apparatus which images a site appearing as a defect on a sample by using a charged particle beam, and which detects a genuine defect from the captured image.

Figure 1:
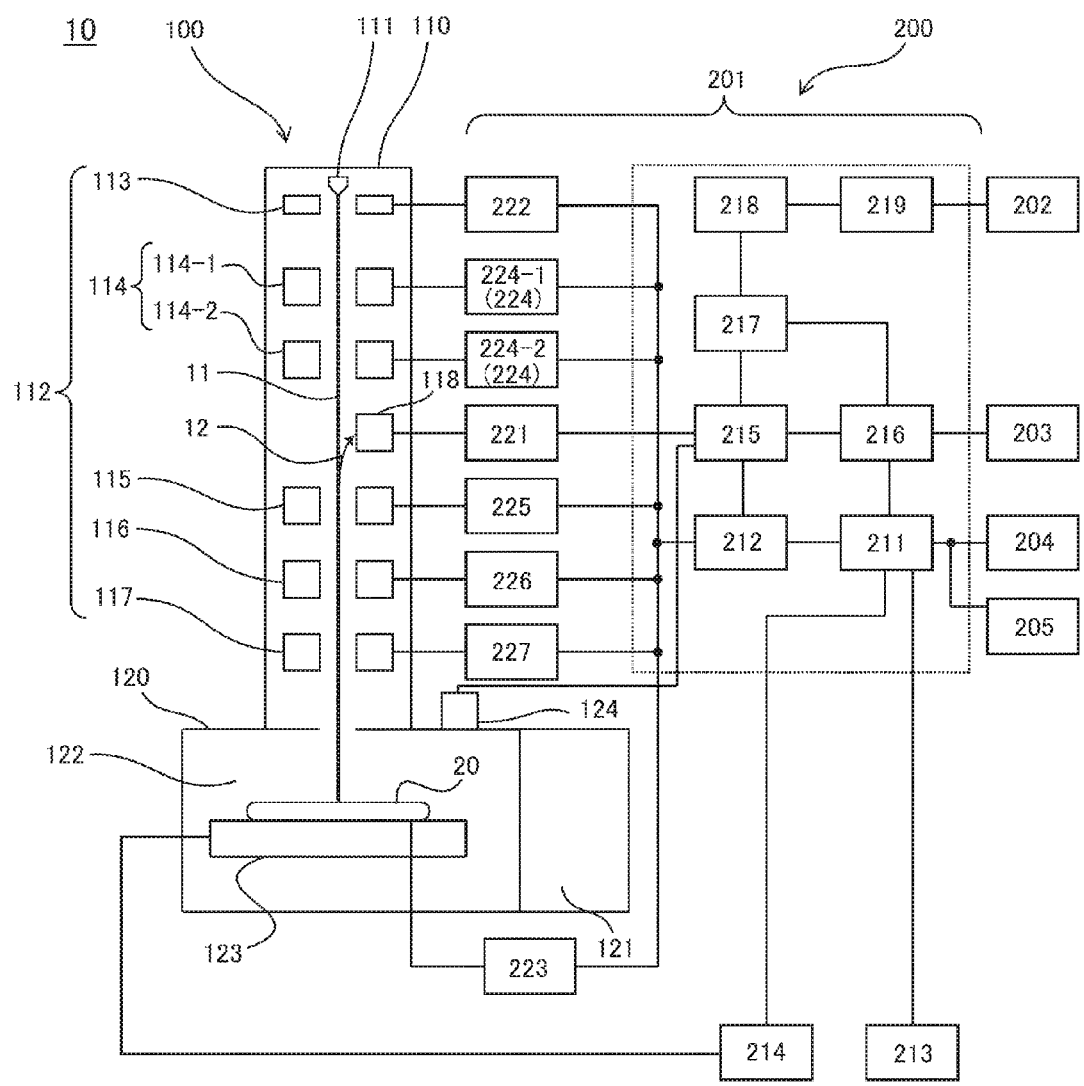
FIG. 1 is a schematic configuration diagram of a defect review SEM as an embodiment of a charged particle beam apparatus according to the present invention.

FIG. 1 is a schematic configuration diagram of the defect review SEM as an embodiment of the charged particle beam apparatus according to the present invention.

In FIG. 1, a defect review SEM 10 has a SEM main body 100 and an observation control unit 200.

The SEM main body 100 has a column 110 including a charged particle source 111 and an electronic optical system 112, and a sample accommodation housing 120 in which a sample exchange chamber 121 and a sample chamber 122 are formed. A primary electron beam 11 generated in the charged particle source 111 is emitted from the column 110 via the electronic optical system 112 to a sample 20 arranged inside the sample chamber 122 of the sample accommodation housing 120. The electronic optical system 112 includes an extraction electrode 113, a condenser lens 114 having a first condenser lens 114-1 and a second condenser lens 114-2, an alignment coil 115, a deflector (scanning deflector) 116, and an objective lens 117. Furthermore, the column 110 has a secondary electron detector 118 which detects a secondary electron beam 12 generated from the sample 20 by emitting the primary electron beam 11.

The sample chamber 122 has a sample stage 123 on which the sample 20 is placed. The sample stage 123 is movable inside the sample chamber 122 by a stage moving mechanism (not illustrated). The sample 20 placed thereon is movable together with the sample stage 123 inside a plane perpendicular to an optical axis of the electronic optical system 112 and along an optical axis direction of the electronic optical system 112. The sample chamber 122 and the sample exchange chamber 121 are partitioned by a gate valve (not illustrated) in an airtight manner. When the sample 20 placed on the sample stage 123 is exchanged, pressure of the sample exchange chamber 121 is adjusted so as to enable sample exchange while the sample chamber 122 and the column 110 internally maintain a vacuum state. In addition, the sample chamber 122 has an optical microscope 124 including a CCD camera for use in capturing a light microscope image of the sample 20.

The observation control unit 200 has a main body control unit 201, a display monitor 202, an image display unit 203, an operator's operating monitor 204, and an external interface 205. Furthermore, the main body control unit 201 is configured to have an apparatus control unit 211, an electronic optical system control unit 212, a conveyance control unit 213, a stage control unit 214, an image processing control unit 215, an image correction control unit 216, an image memory 217, a defect detection control unit 218, an automatic defect classification control unit 219, an amplifier 221, a high voltage control unit 222, a retarding voltage control unit 223, a first condenser lens control unit 224-1, a second condenser lens control unit 224-2, an alignment control unit 225, a deflection current control unit 226, and an objective lens control unit 227.

In the main body control unit 201, the apparatus control unit 211 controls the overall apparatus based on a recipe which is preset and input, and controls automatic defect review (ADR) and automatic defect classification (ADC) to be performed via other control units of the main body control unit 201.

For example, the apparatus control unit 211 controls the sample passing through the sample exchange chamber 121 to be loaded to and unloaded from the sample chamber 122 via the conveyance control unit 213. In the conveyance control unit 213, an operation of a conveyance mechanism or a gate valve (not illustrated) is controlled by inputting a sample loading instruction from the apparatus control unit 211. The sample 20 is loaded to the sample chamber 122 via the sample exchange chamber 121, and is placed on the sample stage 123. In addition, the sample 20 placed on the sample stage 123 is unloaded outward from the sample chamber 122 via the sample exchange chamber 121 by inputting a sample unloading instruction.

In addition, when the sample is loaded, the apparatus control unit 211 causes the image processing control unit 215 to acquire the light microscope image of the entire surface of the sample imaged by the CCD camera of the optical microscope 124. Based on this light microscope image, the apparatus control unit 211 performs global alignment so as to correct coordinate deviation or rotation deviation between the sample 20 and the sample stage 123 via the stage control unit 214. In addition, in a case where high accuracy correction of the coordinate deviation or rotation deviation is further required, the apparatus control unit 211 may concurrently perform correction using the light microscope image and high magnification global alignment after acquiring an electron microscope image.

In addition, based on inspection result data input via the external interface 205 from a defect inspection apparatus (not illustrated), the apparatus control unit 211 performs a defect detection process on each sampling-designated defect candidate in accordance with recipe information of the recipe.

In this case, when the captured image of the site appearing as the defect on the sample is acquired, the apparatus control unit 211 performs movement control on the sample stage 123 via the stage control unit 214 in view of a correction amount obtained through the global alignment, based on a coordinate position of the defect candidate included in the inspection result data. The apparatus control unit 211 locates a central coordinate position of the defect candidate on the optical axis of the electronic optical system 112 so that the site appearing as the defect on the sample can be accurately scanned with the electron beam 11. In addition, when the scanning using the electron beam 11 is performed, based on an electronic optical system condition such as an acceleration voltage, a retarding voltage, and imaging magnification, the apparatus control unit 211 controls each unit of the electronic optical system 112 via the electronic optical system control unit 212 so as to emit the optimal primary electron beam 11 onto the sample.

In this manner, a charged particle (electron) generated in the charged particle source 111 is extracted as the primary electron beam 11 from the extraction electrode 113 controlled by the high voltage control unit 222. The primary electron beams 11 are converged after passing through the first condenser lens 114-1 and the second condenser lens 114-2 which are controlled by first condenser lens control unit 224-1 and the second condenser lens control unit 224-2. The primary electron beams 11 are focused once (called crossover), and probe diameter and a probe current thereof are adjusted. Axial adjustment is performed on the primary electron beams 11 in the alignment coil 115 controlled by the alignment control unit 225. The primary electron beams 11 are focused on the sample 20 after passing through the objective lens 117 controlled by the objective lens control unit 227. In addition, through an operation of the deflector 116 controlled by the deflection current control unit 226, the primary electron beams 11 are used in the scanning around the coordinate position of the defect candidate on the sample 20.

In addition, the apparatus control unit 211 concurrently controls the primary electron beam 11 to be emitted to this sample 20, and causes the image processing control unit 215, the image correction control unit 216, and the defect detection control unit 218 to generate the captured image of the site on the sample scanned with the primary electron beam 11, to generate the integrated frame image based on the scanning performed multiple times on the same site on the sample with the primary electron beam 11, and to acquire accurate position information on the sample for the site appearing as the defect on the sample.

That is, if the sample 20 is scanned with the primary electron beam 11, the secondary electron beam 12 generated on the surface of the sample is detected by the secondary electron detector 118. The detection output is amplified by the amplifier 221, and is supplied to the image processing control unit 215.

In synchronization with a scanning control instruction output from the electronic optical system control unit 212 to the deflection current control unit 226, the image processing control unit 215 receives the detection output of the secondary electron detector 118 via the amplifier 221, and converts the detection output into brightness information so as to generate the captured image of the site on the sample scanned with the primary electron beam 11. Then, the generated captured image is stored in the image memory 217, and is transmitted to the image correction control unit 216.

If the image processing control unit 215 generates multiple captured images for the same site on the sample, the image correction control unit 216 generates the integrated frame image of the multiple captured images, thereby performing a brightness correction process of the captured images for the site on the sample. Then, the generated integrated frame image is stored in the image memory 217, and is transmitted to the image display unit 203 for display.

With regard to the defect candidate which is the site appearing as the defect on the sample 20, if low magnification imaging starts based on the coordinate position of the defect candidate included in the inspection result data, and the low magnification defect image of the defect candidate starts to be stored in the image memory 217, the defect detection control unit 218 generates the difference image between the low magnification defect image or the integrated frame image of the defect candidate and the low magnification reference image of the defect candidate, and specifies the more accurate coordinate position of the defect candidate (position information of the defect candidate) on the sample, from the difference image. Then, if the accurate position information of the defect candidate on the sample is specified, while the defect detection control unit 218 cooperates with the apparatus control unit 211, the defect detection control unit 218 performs high magnification imaging on the region appearing as the defect of the defect candidate, based on the accurate position information so as to acquire the high magnification defect image of the defect candidate. Then, the acquired high magnification defect image of the defect candidate and the review result of the defect candidate included in the specified position information are automatically transmitted to the automatic defect classification control unit 219.

Based on the high magnification defect image of the defect candidate which is transmitted from the defect detection control unit 218, the automatic defect classification control unit 219 classifies and analyzes the detected defect, and displays the result on the display monitor 202.

In the units, the apparatus control unit 211, the electronic optical system control unit 212, the image processing control unit 215, the image correction control unit 216, the image memory 217, the defect detection control unit 218, and the automatic defect classification control unit 219 can be integrally configured by a computer device including a CPU, a memory, and I/O interface. In addition, the display monitor 202, the image display unit 203, and the operator's operating monitor 204 can be configured by computer-attached devices such as a display and an input operation device which are attached to the computer device.

Next, a defect review sequence performed by using the defect review SEM according to the present embodiment will be described with reference to FIG. 2.

Figure 2:
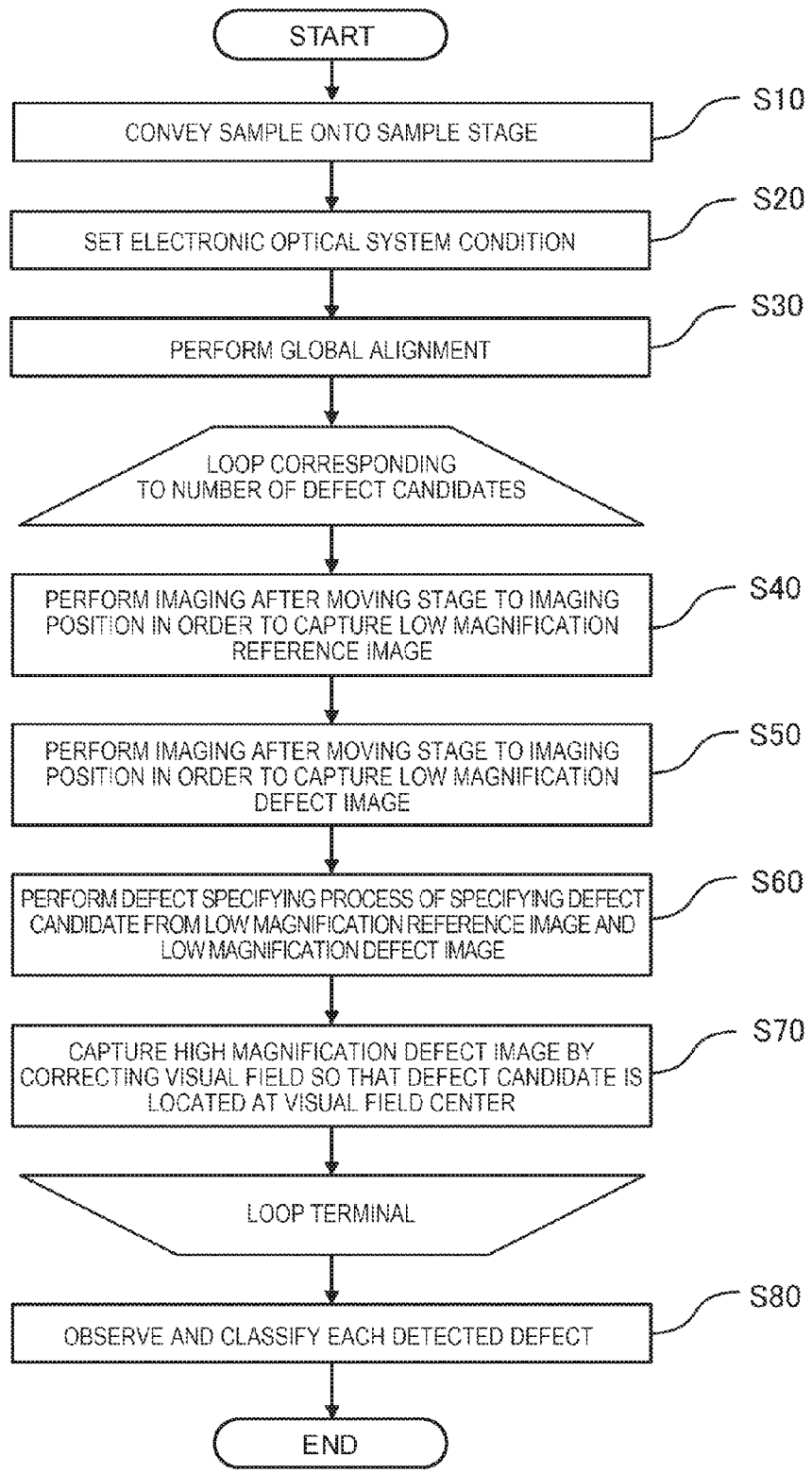
FIG. 2 is a flowchart illustrating an application example of a defect review sequence of the defect review SEM according to the present embodiment.

FIG. 2 is a flowchart illustrating an application example of the defect review sequence of the defect review SEM according to the present embodiment.

In the defect review SEM 10, if a starting instruction of the automatic defect review (ADR) is input from the operator's operating monitor 204 to the apparatus control unit 211, the apparatus control unit 211 performs operation control on a conveyance mechanism or a gate valve (not illustrated) via the conveyance control unit 213. The sample 20 is loaded to the sample chamber 122 through the sample exchange chamber 121, and starts to be placed on the sample stage 123 (S10).

In addition, in the defect review SEM 10, the recipe is read by the apparatus control unit 211 via the external interface 205. In the defect review SEM 10, in accordance with the recipe information (observation information) of the recipe, the electronic optical system condition such as the acceleration voltage and the probe current is set in the electronic optical system control unit 212 (S20).

In the recipe, the recipe information includes a defect ID of each defect candidate which is sampled in advance for defect detection, based on the inspection result data of the sample 20 by using an appearance inspection apparatus, position information on the sample, and the image acquisition condition of the defect candidate, for example, the electronic optical system condition such as the acceleration voltage, the retarding voltage, and the imaging magnification.

Here, the defect candidate for defect detection can be directly designated by the recipe information as described above. Alternatively, the defect candidate for defect detection can be designated by the recipe information after the inspection result data from the appearance inspection apparatus is received so that the defect candidate can be sampled automatically on the defect review SEM 10 side or manually by using the operator's operating monitor 204. In addition, the electronic optical system condition can also be designated by the recipe information so that predetermined data therein can be set or changed manually by using the operator's operating monitor 204.

In the defect review SEM 10, if the sample is loaded and is placed on the sample stage 123 as illustrated in Step S10, the light microscope image of the entire surface of the sample 20 placed on the sample stage 123 is captured by the CCD camera of the optical microscope 124, and is supplied to the image processing control unit 215. The apparatus control unit 211 performs the global alignment, based on the light microscope image (S30). In the defect review SEM 10, the global alignment corrects the position deviation between the coordinate on the sample and the coordinate relating to movement control of the sample stage 123, or the rotation deviation, thereby allowing both coordinates to be positioned.

In this manner, if the sample 20 is completely placed on the sample stage 123, the electronic optical system condition is set, and the global alignment is completed, in the defect review SEM 10, the defect detection process illustrated in Steps S40 to S70 are repeatedly performed on each sampled defect candidate as many as the p-number of sampled defect candidates.

In the defect detection process, based on the recipe, the sample stage 123 is moved for one defect candidate among the p-number of sampled defect candidates by the apparatus control unit 211 via the stage control unit 214 so that a reference position coordinate on the sample having the same pattern as the defect candidate formed therein is located on the optical axis of the electronic optical system 112. Then, the electronic optical system 112 is operated via the electronic optical system control unit 212 under the low magnification (low accuracy) electronic optical system condition. The site to be defined at the reference position on the sample is scanned with the primary electron beam 11. As a result, based on the detection output of the secondary electron beam 12 from the secondary electron detector 118 at that time, the image processing control unit 215 generates the low magnification reference image in which the reference position on the sample is located at a visual field center (S40).

With regard to the acquisition of the low magnification reference image for the defect candidate illustrated in Step S40, if the apparatus control unit 211 is configured to be capable of acquiring CAD data to be formed when the sample 20 is designed, via the external interface 205, the CAD data of the region appearing as the defect of the defect candidate can be alternatively acquired as the low magnification reference image.

If the low magnification reference image is completely acquired for the defect candidate, based on the recipe, the sample stage 123 at this moment is moved by the apparatus control unit 211 via the stage control unit 214 so that the coordinate position of the defect candidate on the sample is located on the optical axis of the electronic optical system 112. Then, the electronic optical system 112 is operated via the electronic optical system control unit 212 under the low magnification electronic optical system condition of the recipe information, and the scanning using the primary electron beam 11 is performed. As a result, based on the detection output of the secondary electron beam 12 from the secondary electron detector 118 at that time, the image processing control unit 215 generates the low magnification defect image in which the coordinate position of the defect candidate on the sample is located at the visual field center (S50).

On the other hand, in the defect detection control unit 218, based on the low magnification reference image of the defect candidate acquired in this way and stored in the image memory 217 and the low magnification defect image, image processing for generating the difference image binarized between both images is performed as the defect detection process. The region appearing as the defect of the defect candidate is detected from the difference image, and the central coordinate on the sample is determined (S60).

In accordance with the determination, the sample stage 123 at this moment is moved by the apparatus control unit 211 via the stage control unit 214 so that the determined central coordinate of the region appearing as the defect is located on the optical axis of the electronic optical system 112. Then, based on the recipe, the electronic optical system 112 is operated via the electronic optical system control unit 212 under the high magnification (high accuracy) electronic optical system condition. The region appearing as the defect of the defect candidate on the sample is scanned with the primary electron beam 11. As a result, in the image processing control unit 215, based on the detection output of the secondary electron 12 from the secondary electron detector 118 at that time, the image processing control unit 215 generates the high magnification defect image of the defect candidate in which the central position of the region appearing as the defect on the sample is located at the visual field center (S70).

In the defect review sequence, the defect detection processes illustrated in Steps S40 to S70 are successively performed on all of the sampled defect candidates in accordance with the recipe information.

Moreover, in the defect review SEM 10, based on the defect candidate review result including the high magnification defect image of the defect candidate which is acquired by the defect detection control unit 218 and the specified position information, it is determined whether the defect candidate is a genuine defect or a false candidate. The automatic defect classification control unit 219 classifies the defect in a diversified manner based on a shape and the like (S80).

Incidentally, in order to improve a throughput in the defect review sequence performed by using the defect review SEM, any one or all of a stage moving time, an image capturing time, and a defect detection process time in the defect review sequence may be shortened. However, the stage moving time among them is previously shortened owing to an improved current motor control technique. Accordingly, the considerably shortened stage moving time cannot be expected.

In the defect review SEM 10 according to the present embodiment, first, in Step S60 during the defect review sequence, as the defect detection process, the defect detection control unit 218 performs image processing for generating the difference image binarized between the low magnification reference image and the low magnification defect image of the defect candidate. In this case, as the low magnification defect image of the defect candidate, the integrated frame image of the low magnification defect image of the defect candidate which is generated by the image correction control unit 216 is used. In the integrated frame image of the low magnification defect image of the defect candidate, the image processing control unit 215 does not change the electronic optical system condition of the primary electron beam 11 for one defect candidate. Whenever the low magnification defect image in which the same coordinate position on the sample is located at the visual field center is generated, the image correction control unit 216 generates and updates the low magnification defect images of the defect candidate which are captured so far and whose frames are integrated.

Figure 3:
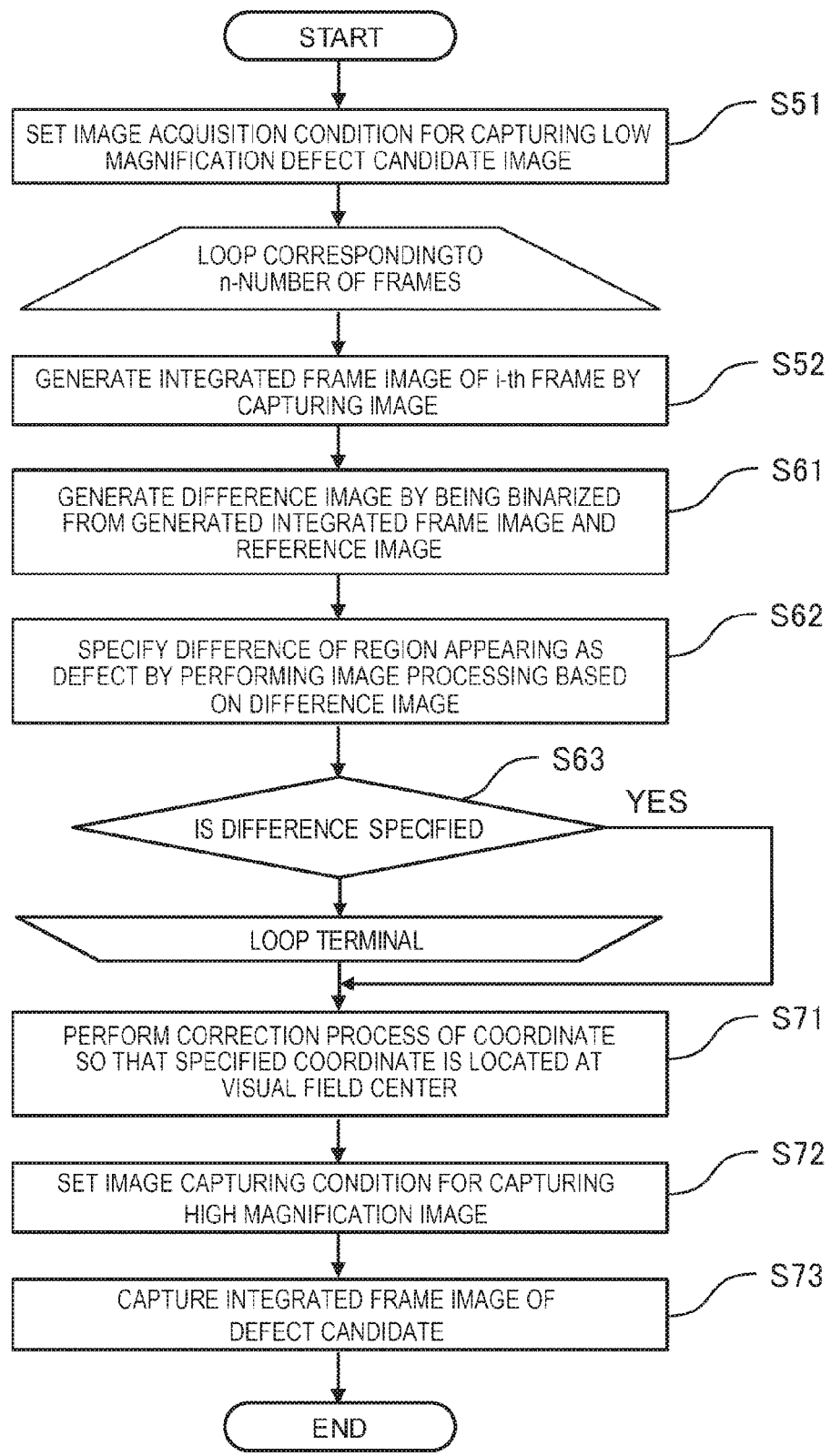
FIG. 3 is a flowchart further illustrating details of a defect detection process for one defect candidate in an inspection sequence illustrated in FIG. 2.

FIG. 3 is a flowchart further illustrating details of the defect detection process for one defect candidate in the inspection sequence illustrated in FIG. 2. That is, FIG. 3 relates to the defect detection process for one defect candidate which is illustrated in Steps S40 to S70 in FIG. 2, and corresponds to a more specific application example relating to a process of acquiring the low magnification defect image, a process of specifying the region appearing as the defect, and a process of acquiring the high magnification defect image.

First, with regard to the process of acquiring the low magnification defect image which is illustrated in Step S50 in FIG. 2, before imaging starts for one defect candidate in which the coordinate position on the sample is arranged on the optical axis of the electronic optical system 112, the apparatus control unit 211 causes the electronic optical system control unit 212 and the image processing control unit 215 to set control information based on the image acquisition condition such as the magnification and the n-number of integrated image frames (S51). The image acquisition condition such as the magnification and the n-number of integrated image frames is set, based on the recipe information of the recipe which is read via the external interface 205. Alternatively, based on the instruction of the recipe information, before imaging starts for one defect candidate, the image acquisition condition is set or changed manually by using the operator's operating monitor 204. In addition, the image acquisition condition includes setting of either a raster scanning method or a vector scanning method relating to a scanning method of the electron beam (primary electron beam 116). However, these will be separately described later.

According to the present application example, the process of acquiring the low magnification defect image for one defect candidate and the process of specifying the region appearing as the defect which are illustrated in Steps S50 and S60 in FIG. 2 are performed by repeatedly performing the process illustrated in Steps S52 to S63 in FIG. 3, maximum n-times, and by using the integrated frame image of the low magnification defect image having at least one frame or the maximum n-number of frames for one defect candidate. In other words, according to the present application example, with regard to one defect candidate, as the low magnification defect image used for generating the difference image with the low magnification reference image, the integrated frame image is used which is obtained by adding the frames of the low magnification defect image having at least one frame or the maximum n-number of frames.

Therefore, if in Step S51, the apparatus control unit 211 completely sets the image acquisition condition such as the magnification and the n-number of integrated frames, the electronic optical system control unit 212 and the image processing control unit 215 cooperate with each other so as to capture the low magnification defect image of the i-th frame (however, i is a natural number equal to or smaller than n) of one defect candidate. The low magnification defect image is stored in the image memory 217, and is transmitted to the image correction control unit 216. The image correction control unit 216 generates the integrated frame image of the low magnification defect image acquired up to the i-th frame for one defect candidate, and performs the brightness correction process on the low magnification defect image. The integrated frame image of the generated low magnification defect image is stored in the image memory 217, and is transmitted to and displayed on the image display unit 203 (S52).

In the defect detection control unit 218, the i-th frame of the low magnification defect image is captured for one defect candidate. Each time the integrated frame image of the low magnification defect image is generated up to the i-th frame, a process of specifying the region appearing as the defect (defect detection process in a narrow sense) is performed. Then, in the defect detection control unit 218, if the i-th frame of the low magnification defect image is captured for one defect candidate, as the low magnification defect image used for generating the difference image with the low magnification reference image during the process of specifying the region appearing as the defect, the integrated frame image of the low magnification defect image up to the i-th frame is acquired. The difference image subjected to image processing such as noise removal and contrast enhancement between the integrated frame image of the low magnification defect image up to the i-th frame and the low magnification reference image is generated (S61). Then, based on the difference image, the region appearing as a difference on the difference image is specified (S62). Here, several m of the specified region on the difference image has a possibility that the i-number of integrated image frames may be still insufficient and noise which is not removed from the integrated frame image may remain on the difference image. Accordingly, the number is not necessarily limited to one.

In the defect detection control unit 218, if a region appearing as a difference on the difference image is specified in this way, based on a defect determination index which is set in advance for each specified region (region where the difference appears) in the defect detection control unit 218, defect detection accuracy (defect candidate accuracy) indicating accuracy appearing as the defect is calculated.

Here, the defect detection accuracy is a value which is automatically calculated for each specified region on the difference image by using a predetermined method, for example, based on a parameter such as how much a size of an area of the specified region is greater than a predetermined value which is set in advance, or if a shape of the specified region is not linear, how much a shape change is smaller than a shape of the corresponding region on the difference image generated by using the integrated frame image of the low magnification defect image up to the preceding (i−1)-th frame (how much similar to each other).

Moreover, in the defect detection control unit 218, it is determined whether or not the defect detection accuracy calculated for each specified region on the difference image is equal to or greater than a threshold which is set in advance. In this manner, it is determined whether or not a difference on the difference image can be specified, that is, whether or not the region appearing as the defect on the sample which relates to the defect candidate can be specified (S63).

As a result of the determination, in the defect detection control unit 218, in a case where any defect detection accuracy of each specified region on the difference image is smaller than the threshold, until it is possible to obtain the determination result on whether or not the regions appearing as the defect on the sample which relates to the defect candidate can be specified for the same defect candidate, while the defect detection control unit 218 cooperates with the apparatus control unit 211 so as to sequentially update the integrated frame image of the low magnification defect image, the defect detection control unit 218 appropriately and repeatedly performs the process of specifying the region appearing as the defect which is illustrated in Steps S52 to S63 until the maximum n-th frame is obtained.

In contrast, in a case where any defect detection accuracy of each specified region on the difference image is the same as or exceeds the threshold, at the time of the determination, the process of specifying the region appearing as the defect which is illustrated in Steps S52 to S63 is not performed after the (i+1)-th frame. The process of acquiring the high magnification defect image illustrated after Step S71 (to be described later) is performed on the region appearing as the defect on the sample which relates to the specified defect candidate.

In this manner, as soon as the difference image subjected to image processing such as noise removal and contrast enhancement by updating the integrated frame image of the low magnification defect image is generated, that is, as soon as the site appearing as the genuine defect and other sites generated due to noise on the low magnification defect image are distinguished from each other, the process of specifying the region after the subsequent (i+1)-th frame is stopped. Accordingly, within the time corresponding to each situation of the defect candidate, the region appearing as the genuine defect on the sample can be automatically and accurately specified, thereby improving the throughput.

Subsequently, with regard to the process of acquiring the high magnification defect image, the defect detection control unit 218 acquires the coordinate position on the sample for the region appearing as the specified defect relating to one defect candidate from the difference image of the i-th frame in which the region appearing as the defect is completely specified. The defect detection control unit 218 corrects the coordinate position on the sample for the defect candidate previously acquired from the defect inspection apparatus to the coordinate position of the region appearing as the specified defect on the sample (S71). In this case, for example, in a case where the region appearing as the specified defect on the difference image is present at multiple locations, it is possible to locate the central position of the coordinate position of each region appearing as the defect at the corrected coordinate position of the defect candidate on the sample.

Then, in the defect detection control unit 218, in order to perform the image processing on the high magnification defect image of the defect candidate which is illustrated in Step S70 in FIG. 2, the image acquisition condition in which the corrected coordinate position of the defect candidate on the sample is located at the visual field center is set in the apparatus control unit 211 (S72). In this manner, the apparatus control unit 211 captures the high magnification defect image of the defect candidate in which the corrected coordinate position of the defect candidate on the sample is located at the visual field center, via the electronic optical system control unit 212, the stage control unit 214, and the image processing control unit 215 (S73). According to the present application example, the high magnification defect image of the defect candidate is repeatedly captured as many as the predetermined number of integrated image frames which are set in advance. The image correction control unit 216 generates the integrated frame image of the high magnification defect image of the defect candidate. The defect detection control unit 218 causes the image memory 217 to store the generated integrated frame image of the high magnification defect image of the defect candidate in order to prepare the review result of the defect candidate.

According to the defect review SEM 10 of the present application example, as the low magnification defect image of the defect candidate which is used for generating the difference image with the low magnification reference image of the defect candidate, the integrated frame image of the low magnification defect image of the defect candidate is used for one defect candidate. In this manner, the S/N ratio of the low magnification defect image of the defect candidate which is used for generating the difference image with the low magnification reference image of the defect candidate and the difference image is improved. This operation will be described in detail with reference to FIG. 4.

FIG. 4 illustrates an example of the reference image, the defect image, and the difference image between both images, which are acquired in the defect detection process illustrated in FIGS. 2 and 3.

Figure 4A:
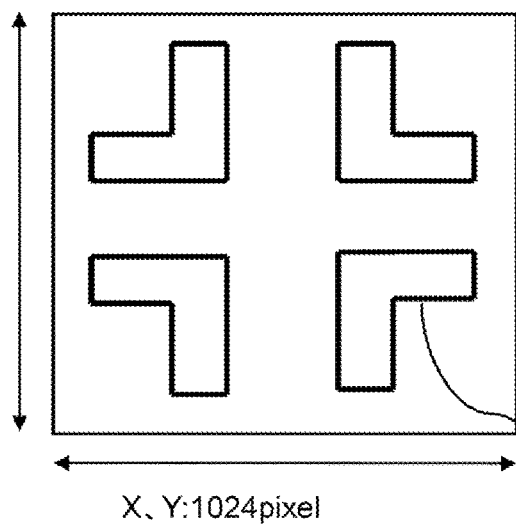
FIGS. 4A-4C illustrate an example of a reference image, a defect image, and a difference image between both images, which are acquired in the defect detection process illustrated in FIGS. 2 and 3.
Figure 4B:
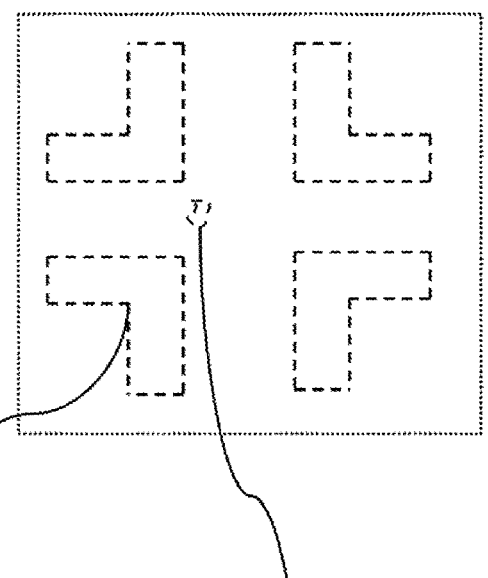
Figure 4C:
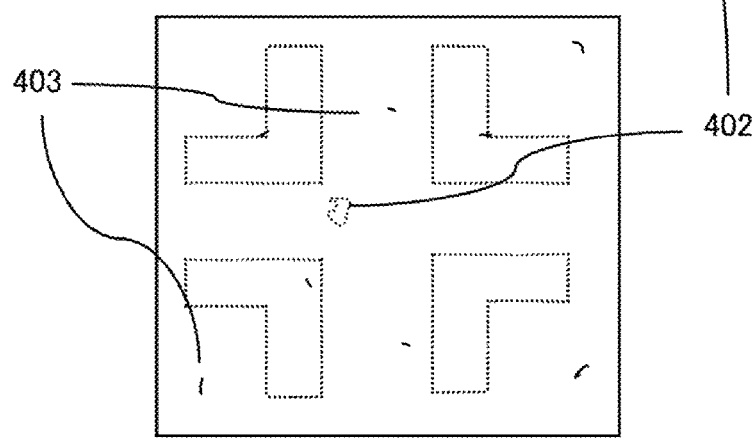

FIG. 4(a) illustrates the low magnification reference image of the defect candidate. Through the process of capturing the low magnification reference image which is illustrated in Step S40 in FIG. 2, the low magnification reference image is also acquired by using the integrated frame image, similarly to the low magnification defect image. In the illustrated example, a size of the region of the integrated frame image of the low magnification reference image is assumed as vertical and horizontal 1,024 pixels. FIG. 4(b) illustrates the low magnification defect image of the defect candidate of the first frame. FIG. 4(c) illustrates the difference image generated by being binarized through the image processing performed by the defect detection control unit 218 from the low magnification reference image and the low magnification defect image in FIGS. 4(a) and 4(b).

In the defect review SEM, as the low magnification defect image of the defect candidate which is used for generating the difference image with the low magnification reference image of the defect candidate as illustrated in FIG. 4(a), the integrated frame image of the low magnification defect image of the defect candidate is used. However, the integrated frame image of the low magnification defect image which is generated based on only the low magnification defect image of the defect candidate of the first frame has a poor S/N ratio of the low magnification defect image itself of the defect candidate of the first frame as illustrated in FIG. 4(b). Accordingly, the difference image generated from the integrated frame image of the low magnification reference image and the low magnification defect image of the defect candidate by the defect detection control unit 218 also has a noise component 403 which is not yet removed as the difference image illustrated in FIG. 4(c), and is in an image state where the image processing is less likely to distinguish a region 402 appearing as the defect of the defect candidate.

Incidentally, according to the defect review SEM 10 of the present application example, in accordance with the increased i-number of integrated image frames of the integrated frame image of the low magnification defect image of the defect candidate, the integrated frame image of the low magnification defect image which is acquired up to the i-th frame used for generating the difference image with the low magnification reference image of the defect candidate has the S/N ratio improved by adding the frames. Accordingly, in Step S63 illustrated in FIG. 3, even when the region appearing as a difference on the difference image is specified, the defect detection accuracy is improved in detecting whether the region appearing as the difference is the region appearing as the genuine defect.

In the process of specifying the region appearing as the defect which is performed by the defect detection control unit 123, in Step S63 illustrated in FIG. 3, it is determined whether or not the specified region is the region appearing as the genuine defect from the defect detection accuracy calculated based on the area or the shape for the specified region on the difference image, concurrently with the process of capturing the low magnification defect image of the (i+1)-th frame, until the electronic optical system control unit 130 and the image processing control unit 127 completely capture the low magnification defect image of the (i+1)-th frame used for generating the integrated frame image of the low magnification defect image up to the subsequent (i+1)-th frame.

In this case, even when the i-number of integrated image frames of the integrated frame image of the low magnification defect image is small, as the i-number of integrated mage frames increases, the specified region on the difference image where the defect detection accuracy is originally high comes to have higher defect detection accuracy than other regions on the same difference image where the defect detection accuracy is originally in an intermediate level. Thus, a difference between the defect detection accuracies increases. That is, even if the i-number of integrated image frames of the integrated frame image of the low magnification defect image increases, the specified region on the difference image where the defect detection accuracy is originally high does not have degraded defect detection accuracy. On the other hand, other specified regions on the same difference image where the defect detection accuracy is originally not so high comes to have degraded defect detection accuracy if the i-number of integrated image frames of the integrated frame image of the low magnification defect image increases. Thus, other regions are not specified on the difference image. As a result, the region appearing as the defect of the defect candidate where the defect detection accuracy is originally high remains specifiable on the difference image, and the noise influencing region where the defect detection accuracy is originally not so high is excluded on the difference image. Accordingly, within the time corresponding to each situation of the defect candidate, the region appearing as the defect of the defect candidate can be automatically and accurately specified, thereby improving the throughput.

In the illustrated example, with regard to the process illustrated in Steps S61 to S63 in FIG. 3, simply acquiring the low magnification defect image of the defect candidate of the first frame of one defect candidate does not enable the image correction control unit 216 to perform a correction process on the integrated frame image of the low magnification defect image of the defect candidate. Accordingly, the S/N ratio decreases, thereby still causing a difficulty in performing the process illustrated in Steps S61 to S63 in FIG. 3. Therefore, in the illustrated example, the process illustrated in Steps S61 to S63 in FIG. 3 is actually to be performed after capturing the low magnification defect image of the defect candidate of the second frame or the subsequent frame, thereby achieving efficiency.

Next, in the above-described defect review SEM 10, another application example of the defect detection process for one defect candidate in an inspection sequence illustrated in FIG. 3 will be described with reference to FIG. 5.

Figure 5:
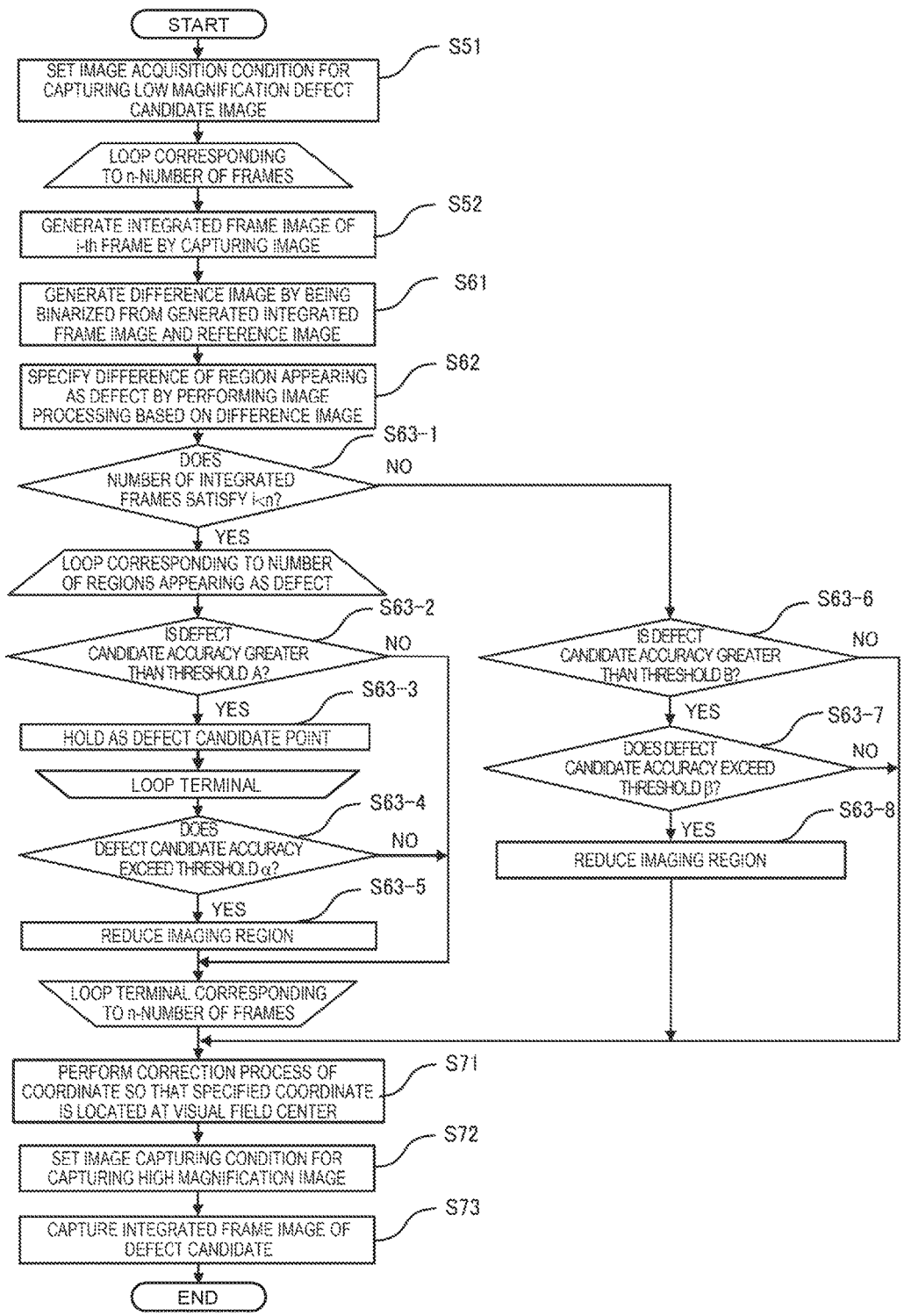
FIG. 5 is a flowchart of another application example of the defect detection process for one defect candidate in the inspection sequence illustrated in FIG. 3.

FIG. 5 is a flowchart of another application example of the defect detection process for one defect candidate in the inspection sequence illustrated in FIG. 3.

In the present application example, during a course while the i-number of integrated image frames of the integrated frame image of the low magnification defect image increases, the specified region on the difference image where the defect detection accuracy is high is extracted from when the i-number of integrated image frames is small. In the meantime the process of acquiring the low magnification defect image (S51 and S52) and the processes of specifying the region appearing as the defect (S61 to S63) are repeatedly performed on one defect candidate, the specified region on the difference image is narrowed. In this manner, it is possible to reduce an image size (a region subjected to a frame adding process, an imaging region) of the integrated frame image of the low magnification defect image, and an image size (a region to be scanned with the primary electron beam 11) of the low magnification defect image to be captured up to the maximum n-th frame in order to generated the integrated frame image of the low magnification defect image.

According to the flowchart of the defect detection process for one defect candidate in the inspection sequence illustrated in FIG. 5, the process illustrated in Step S63 in the flowchart illustrated in FIG. 3 is considerably different. Other processes are the same as or similar to those in the flowchart illustrated in FIG. 3. Thus, the same number of Steps will be given thereto, and repeated description will be omitted.

According to the present application example, the process of Step S63 illustrated in the flowchart in FIG. 3 is changed to the process of Steps S63-1 to S63-8 illustrated in the flowchart in FIG. 5, since the specified region on the difference image is narrowed during a course while the i-number of integrated image frames of the integrated frame image of the low magnification defect image increases. As a threshold of the defect detection accuracy, there are provided two region determination threshold A (low reliability) and threshold B (high reliability) for determining the region appearing as the defect of the defect candidate, and two reduction determination threshold $\alpha$ and threshold $\beta$ for determining whether or not to reduce each image size of the integrated frame image of the low magnification defect image and the low magnification defect image.

In FIG. 5, in Step S62, for example, if the m-number of regions appearing as the difference on the difference image of the i-th frame is specified for one defect candidate, the defect detection control unit 218 sequentially performs a determination process illustrated in Steps S63-1 to S63-8 on each specified region on the generated difference image.

First, in Step S63-1, it is confirmed whether or not the i-number of integrated image frames of the current integrated frame image is smaller than the maximum value n of the number of integrated image frames. In a case where the i-number of integrated image frames is smaller than the maximum value n, the processes illustrated after Step S63-2 are sequentially performed on each m-number of specified regions. In a case where the i-number of integrated image frames is the maximum value n, the determination process illustrated after Step S63-6 is performed.

In Step S63-2, the defect detection accuracy is calculated for the j-th (j is 1, 2, ..., m) specified region. It is determined whether or not the defect detection accuracy is greater than the region determination threshold A (low reliability). As a result, in a case where the defect detection accuracy is smaller than the threshold A, the image size is reduced for the j-th specified region. In a case where the j-th specified region is the region appearing as the genuine defect, it is determined that there is a possibility that the reduction of the image size may be overlooked. Accordingly, the reduction of the image size based on the specified region on the difference image is stopped in the current i-number of integrated image frames. The image size is maintained in a current state from the subsequent (i+1)-th frame, and the integrated frame image is updated in Step S52.

In Step S63-2, in a case where the defect detection accuracy is greater than the region determination threshold A in the j-th specified region, the j-th specified region is held as the candidate of the region appearing as the defect in Step S63-3. At this moment, the process illustrated after Step S63-2 is performed on the subsequent (j+1)-th specified region.

Then, when any one of the m-number of specified regions has the defect detection accuracy which is greater than the region determination threshold A and is held as the candidate of the region appearing as the defect, in Step S63-4, it is determined whether or not any one of the specified regions has the defect detection accuracy which exceeds the reduction determination threshold α.

In a case where based on this determination, any one of the m-number of specified regions has the defect detection accuracy which exceeds the reduction determination threshold α, in Step S63-5, the image size in which the coordinate position of the specified region whose defect detection accuracy exceeds the reduction determination threshold a is located at the visual field center is reduced by changing the image acquisition condition. In Step S52, the integrated frame image is updated from the subsequent (i+1)-th frame by using the reduced image size by locating the coordinate position of the specified region whose defect detection accuracy exceeds the reduction determination threshold a at the visual field center. In Step S63-5, for example, in a case where the specified region whose defect detection accuracy exceeds the reduction determination threshold a is present at multiple locations, it is possible to use the image size in which the center position of the coordinate position of each specified region is located at the visual field center.

Therefore, according to the present application example, from when the integrated frame image is updated after the (i+1)-th frame, the throughput is improved as much as the reduced image size in the process of specifying the region appearing as the detect which is illustrated in Steps S52 to S63-5. The visual field center is located in the region appearing as the defect where the defect detection accuracy based on the reduction determination of the image size is high, and can be moved so as not to be overlooked.

In contrast, in Step S63-4, in a case where any defect detection accuracy of the m-number of respective specified regions does not exceed the reduction determination threshold α, if the image size is also reduced, it is determined that there is a possibility of being overlooked in a case where any one of the m-number of specified regions is the region appearing as the genuine defect. The image size is maintained in a current state from the subsequent (i+1)-th frame, and the integrated frame image is updated in Step S52.

On the other hand, in Step S63-1, in a case where the i-number of integrated image frames of the current integrated frame image is the maximum value n of the number of integrated image frames, it is determined in Step S63-6 whether or not any specified region has the defect detection accuracy which is greater than the region determination threshold B (high reliability).

Then, in a case where any defect detection accuracy of the specified regions is smaller than the region determination threshold B, if the image size is reduced, it is determined that there is a possibility of being overlooked in a case where the integrated frame image of the high magnification defect image of one defect candidate illustrated after Step S71 is acquired and the specified region is the region appearing as the genuine defect in the defect detection process of the subsequent defect candidate. The image size is maintained in a current state, and the process after Step S71 is performed.

In contrast, in a case where any defect detection accuracy of the specified regions is greater than the region determination threshold B, it is determined in Step S63-7 whether or not any defect detection accuracy of the specified regions exceeds the reduction determination threshold value β.

In a case where any defect detection accuracy of the specified regions exceeds the reduction determination threshold β, in Step S63-8, the image size in which the coordinate position of the specified region whose defect detection accuracy exceeds the reduction determination threshold β is located at the visual field center is reduced by changing the image acquisition condition. The image processing is performed by using the reduced image size in acquiring the integrated frame image of the high magnification defect image of one defect candidate which is illustrated after Step S71. In Step S63-8, for example, in a case where the specified region whose defect detection accuracy exceeds the reduction determination threshold β is present at multiple locations, it is possible to use the reduced image size in which the center position of the coordinate position of each specified region is located at the visual field center. Therefore, according to the present application example, the throughput is improved in the process illustrated after Step 71. The visual field center is located in the region appearing as the defect where the defect detection accuracy based on the reduction determination of the image size is high, and can be moved so as not to be overlooked.

In contrast, in a case where any defect detection accuracy of the specified regions does not exceed the reduction determination threshold β, if the image size is also reduced, it is determined that there is a possibility of being overlooked in a case where the specified regions is the region appearing as the genuine defect. While the image size is maintained in a current state, the image processing is performed in the process after Step S71.

Here, the defect candidate accuracy used in the comparison between the region determination threshold A (low reliability) and threshold B (high reliability) for determining the region appearing as the defect of the defect candidate, and the comparison between the two reduction determination threshold α and threshold β for determining whether or not to reduce each image size of the integrated frame image of the low magnification defect image and the low magnification defect image has the following parameter reflected therein for each specified region on the difference image. For example, the parameter includes how much the size of the area of the specified region is greater than the predetermined value which is set in advance, and if a shape of the specified region is not linear, how much a shape change is smaller than a shape of the corresponding region on the difference image generated by using the integrated frame image of the low magnification defect image up to the preceding (i−1)-th frame (how much similar to each other). The defect candidate accuracy may have a different parameter configuration in accordance with each determination purpose, between the region determination threshold A (low reliability) and threshold B (high reliability) and the reduction determination threshold α and threshold β.

In addition, the image size is reduced for the defect candidate region or the specified region on the difference image by reducing a region (for example, ½) scanned with the primary electron beam 11 around the visual field. In this case, a reducing width of the scanning region in a direction X/Y is appropriately determined, based on the area or the shape of the defect candidate region. Normally, this is a case where the region appearing as the defect of the defect candidate is present at multiple locations on the difference image relating to the defect candidate, and where the imaging regions of the respective defect candidates overlap each other even if the imaging region of the selected defect candidate is reduced. If the overlapping regions are imaged multiple times, risk factors of electrostatic discharge damage increase.

Therefore, in a case where the imaging regions are adjacent to or superimposed on each other, it is necessary to determine whether or not to reduce the imaging regions.

Figure 6A:
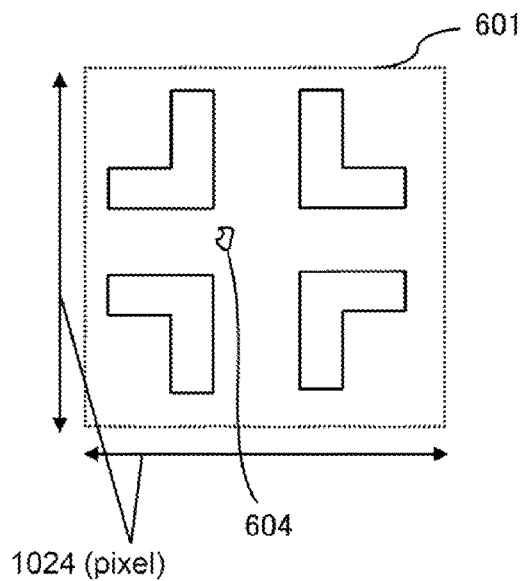
FIGS. 6A-6C schematically illustrate reduction of an image size used in imaging a specified region on the difference image during the defect detection process for one defect candidate in the inspection sequence illustrated in FIG. 5.
Figure 6B:
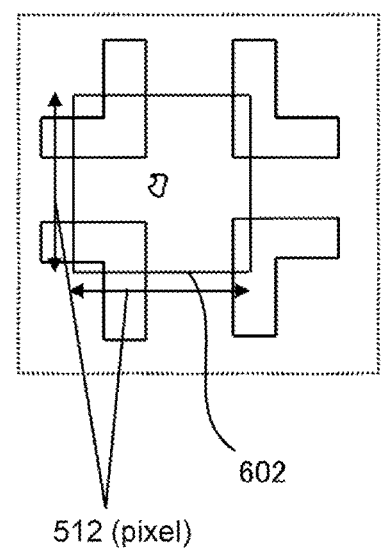
Figure 6C:
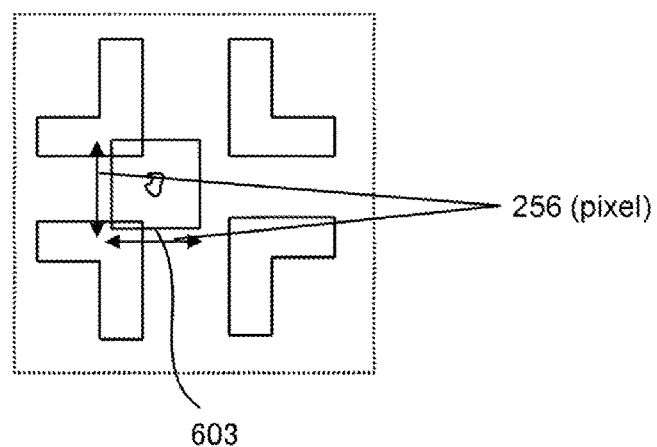

FIG. 6 schematically illustrates the reduction of the image size used in imaging the specified region on the difference image during the defect detection process for one defect candidate in the inspection sequence illustrated in FIG. 5.

FIG. 6(*a*) illustrates the image size of an imaging region 601 for capturing the low magnification defect image, based on the image acquisition condition in Step S51 in FIG. 5, before the image size is reduced. In the illustrated example, the image size is assumed as vertical and horizontal 1,024 pixels. FIG. 6(*b*) illustrates the image size of an imaging region 602 when the image size is reduced in order to select and image a specified region 604 on the difference image with low reliability, and illustrates a region whose image size is vertical and horizontal 512 pixels, and where the imaging region 601 is reduced to ½. FIG. 6(*c*) illustrates the image size of an imaging region 603 when the image size is reduced in order to select and image the specified region 604 on the difference image with high reliability, and illustrates a region whose image size is further reduced to vertical and horizontal 256 pixels.

Next, in the defect review SEM 10 according to the present application example, the throughput of the defect detection process will be described.

First, according to a method in the related art in which the process of acquiring the low magnification defect image and the process of specifying the region appearing as the defect are not concurrently performed on one defect candidate, a defect detection time d is expressed by Expression (1).

$$d = T \times n + t \times s \times n \quad \text{Expression (1)}$$

In this case, n represents the number of integrated frame images, T represents an imaging time (ms) of one frame, and s represents an image size (area) (vertical pixel×horizontal pixel). In addition, T×n represents an imaging time from the first frame to the n-th frame, and t×s×n represents a time for the defect detection process from the first frame to the n-th frame.

Next, as illustrated in the defect review SEM 10 according to the present application example, in a case where the process of acquiring the low magnification defect image and the process of specifying the region appearing as the defect are concurrently performed on one defect candidate, the defect detection time d is expressed by Expression (2).

$$d = T \times 1 + T \times (n-1) + t \times s \times 1 \quad \text{Expression (2)}$$

In this case, while the first frame is imaged, the defect detection process cannot be performed on the first frame. Therefore, T×1 represents the imaging time of the first frame, T×(n−1) represents the imaging time from the second frame to the n-th frame, and also represents the time for the defect detection process from the first frame to the (n−1)-th frame. t×s×1 represents the time for the defect detection process of the n-th frame.

Therefore, according to the defect detection process illustrated in FIG. 3, the time for the defect detection process from the first frame to the (n−1)-th frame is shortened, thereby correspondingly improving the throughput of the defect detection process.

Furthermore, as illustrated in FIG. 5, in a case where the image size is intended to be reduced for the i-th frame (i<n), the case is expressed by Expression (3) for convenience.

$$dxy = T \times (1{,}024/1{,}024) \times (1{,}024/1{,}024) \times 1 + T \times (1{,}024/1{,}024) \times (1{,}024/1{,}024) \times (i-1) + T \times (X/1{,}024) \times (Y/1{,}024) \times (n-i) + t \times (X/1{,}024) \times (Y/1{,}024) \times 1 \quad \text{Expression (3)}$$

In this case, if the length of the imaging region in the horizontal direction is set to X (pixel) (however, X≤1,024), and the length in the vertical direction is set to Y (pixel) (however, Y≤1,024), the time required for the process in a case where the defect is detected is proportional to an area ratio. Therefore, T×1×1×1 represents the imaging time of the first frame, T×1×1×(i−1) represents the imaging time from the second frame to the i-th frame, and also represents the time for the defect detection process from the first frame to the (i−1)-th frame. T×(X/1,024)×(Y/1,024)×(n−i) represents the imaging time from the (i+1)-th frame to the n-th frame in a case where the image size is reduced to X/1,024 and Y/1,024. t×(X/1,024)×(Y/1,024)×1 represents the time for the defect detection process of the n-th frame.

Here, in order to further facilitate understanding, it is assumed that the imaging time T of one frame and the time t for the defect detection process are the same as each other (T=t). If it is assumed that the image size is reduced to X/1,024 and Y/1,024 in the i-th frame, Expression (3) is expressed by Expression (4).

$$dxy = T \times (1{,}024/1{,}024) \times (1{,}024/1{,}024) \times i + T \times (X/1{,}024) \times (Y/1{,}024) \times (n+1-i) \quad \text{Expression (4)}$$

As illustrated in Expression (4), if the image size of the imaging region used in detecting the defect is small, the processing time for the defect detection process can be shortened. If the defect is detected in such a way that an imaging case using vertical and horizontal 1,024 pixels is binarized to the imaging region of vertical/horizontal 512 pixels, the processing time is reduced to ¼, compared to a case of 1,024 pixels.

Here, in the defect detection process for one defect candidate in the inspection sequence described with reference to FIG. 5, the n-number of integrated image frames under the image acquisition condition in Step S51 in FIG. 5 is set to 16, the n-number of integrated image frames in a reduced state is set to 8, for example, and the image size is set to vertically and horizontal 512 pixels when the image size is reduced after the defect detection accuracy is greater than the threshold A and exceeds the threshold α in Step S63-5.

Furthermore, the total time dxy for the process in a case where it is assumed that the process of acquiring the low magnification defect image and the process of specifying the region appearing as the defect are concurrently performed represents the imaging time (T×1) of the first frame and the (n−1) number of the captured image frames on which the process of acquiring the low magnification defect image and the process of specifying the region appearing as the defect are concurrently performed. Accordingly, when it is assumed that the processing time required for imaging one frame is set to 160 ms and the processing time required for imaging one frame and the time for the defect detection process are the same as each other (160 ms), d is expressed by Expression (2) as follows.

$$d = T \times (n+1) \quad \text{Expression (2)}$$

$$= 160 \text{ ms} \times 17$$

$$= 2{,}720 \text{ ms}$$

However, if the present applicable example is applied to Expression (4), $$d \times y = T \times (1{,}024/1{,}024) \times (1{,}024/1{,}024) \times i + T \times (X/1{,}024) \times (Y/1{,}024) \times (n+1-i) \quad \text{Expression (4)}$$

$$= 160 \times 1 \times 1 \times 8 + 160 \times (512/1{,}024) \times (512/1{,}024) \times (16+1-8)$$

$$= 160 \times 8 + 160 \times (\tfrac{1}{2}) \times (\tfrac{1}{2}) \times 9$$

$$= 1{,}640 \text{ ms}$$

Accordingly, even in a case where the time for the defect detection process is the same as the processing time required for imaging one frame, and is the maximum, the process is completed within the processing time of approximately 60.3% compared to the related art. Therefore, it is possible to achieve the throughput which is improved as much as approximately 40% compared to the related art.

Furthermore, the processing time for acquiring the integrated frame image of the high magnification defect image of one defect candidate which is illustrated after Step S71 is also shortened, thereby further improving the throughput.

Normally, in the defect observation apparatus such as the defect review SEM, in order to improve defect detection accuracy, an image processing algorithm such as noise removal and smoothing is applied thereto. However, there is a problem in that image quality used in detecting the defect has to be improved well together. In the previous description, the scanning and imaging are performed with the electron beam by using the raster scanning method. According to the vector scanning method, the scanning direction can be changed in units of one pixel. Accordingly, for example, if it is assumed that a line & space pattern is formed on the sample surface, even when the scanning is performed in the direction the same as the line length direction of the line & space pattern, contrast of a line edge is less likely to be enhanced if the number of integrated frames is small.

As the S/N ratio is improved, the defect detection accuracy is also improved. It also becomes easy to naturally determine the shape of the region appearing as the defect. Accordingly, if the contrast of the edge of the region appearing as the defect is improved by changing the scanning direction, it becomes easy to determine the shape in the defect detection process. Therefore, the number of integrated frames can be reduced. A method in a case where the vector scanning method is used will be described with reference to FIG. 7.

FIG. 7 is a view for describing a case where the vector scanning method is used as the scanning method.

Figure 7A:
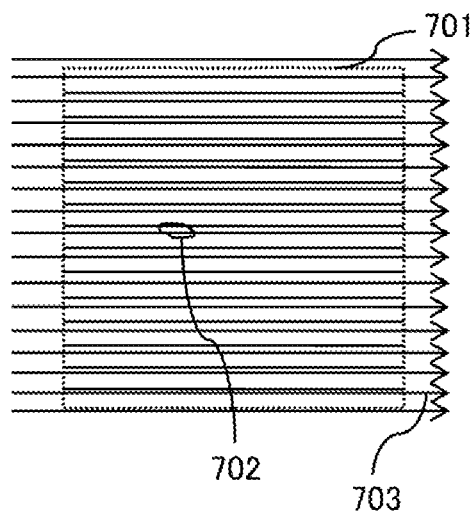
FIGS. 7A-7D illustrate a contrast difference between a region appearing as a defect and a scanning direction with respect to an imaging region in a case of employing a vector scanning method, in the charged particle beam apparatus according to the present embodiment.
Figure 7B:
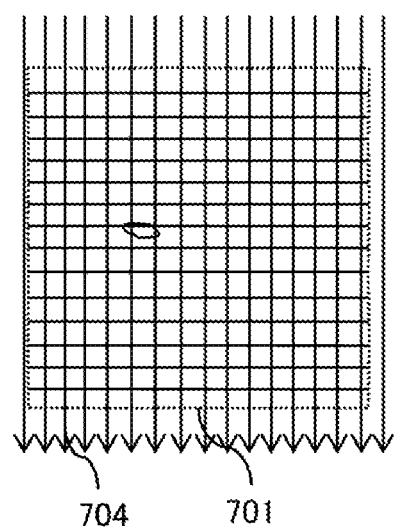

FIG. 7(a) is a schematic view in which scanning is performed in a line & space-formed direction by using a vector scanning method. The scanning with the electron beam is performed on an imaging region 701 in a direction 703 parallel to the line length direction of the line & space pattern. FIG. 7(b) is a schematic view in which the scanning is performed in a direction perpendicular to the line & space-formed direction. The scanning with the electron beam is performed on the scanning region 701 in a direction 704.

Figure 7C:
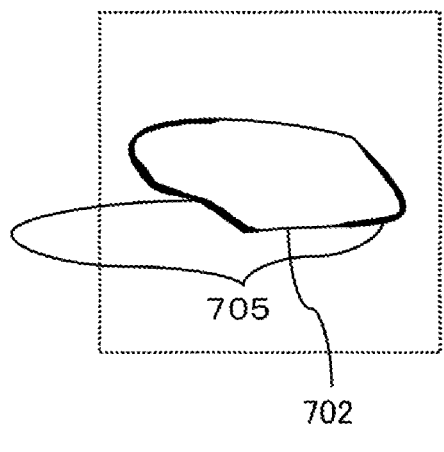

If the scanning is performed in only the same direction, the contrast in the vicinity of right and left edges of a region 702 appearing as the defect is not formed parallel to the scanning direction. Accordingly, the electron beam is satisfactorily emitted in the scanning, thereby increasing charging intensity. As a result, as illustrated in FIG. 7(c), the contrast shows a difference between a region in the vicinity 705 of right and left edges of the region 702 appearing as the defect and other edge regions.

Figure 7D:
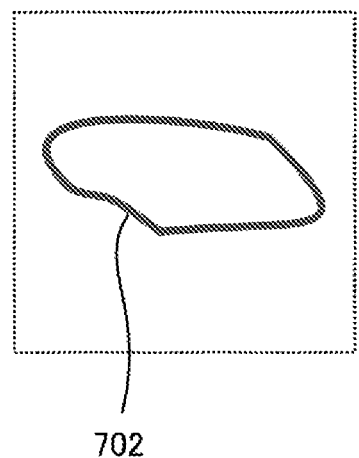

Therefore, the scanning with the electron beam is performed on the imaging region 701 in the vertical direction and the horizontal direction, thereby improving contrast uniformity in the edges. The contrast is improved in the edges as illustrated in FIG. 7(d). In this manner, it becomes easy to determine the shape.

As a matter of course, with regard to the scanning direction, it is preferable that the scanning is performed in the vertical and horizontal directions, the up and down directions, the right and left directions, or the reverse direction. In addition to the vertical direction, the horizontal direction, up and down directions, right and left directions, or the reverse direction, in accordance with the shape of the region appearing as the defect, the scanning direction may be an oblique direction of 45 degrees.

As described with reference to FIG. 3, in the related art, the image of the defect candidate finally selected as the region appearing as the defect is obtained by capturing the integrated frame image of the defect candidate after switching the electronic optical system condition to the high magnification mode and correcting the coordinate to the visual field center of the region appearing as the defect. However, it is possible to image the shape of the region appearing as the defect through the scanning using the vector scanning method and by selecting the optimal scanning direction. Therefore, it is possible to improve image quality of the edge region of the region appearing as the defect.

Therefore, in recent years, under the electronic optical system condition that a difference between the low magnification and the high magnification shows approximately two or three times, an improved image processing technology such as digital zoom does not cause an original image to be degraded to such an extent that the observation and the classification is adversely affected at a later stage, although the image quality slightly becomes degraded. Accordingly, it is possible to omit the imaging performed by correcting the coordinate to the visual field center and switching the electronic optical system condition to the high magnification mode. Using the vector scanning system improves the image quality of the edge of the defect region, thereby improving usability compared to that in the related art.

FIG. 8 illustrates an example of a screen for setting a scanning condition in the charged particle beam apparatus according to an application example of the present disclosure.

The screen (scanning condition setting screen 801) is used for changing the n-number of integrated frames, the thresholds A and B/thresholds α and β for determining the defect candidate accuracy, the reduction ratio which are described with reference to FIG. 5, and the setting of the scanning direction described with reference to FIG. 7.

Although the scanning condition for imaging the region appearing as the defect is set, it is a general way to set 1,024 or 512 pixels for a pixel size 802. If the pixel size 802 is small, the imaging time is shortened in proportion to an area ratio. However, if the pixel size decreases, inspection information is inaccurate. Accordingly, in some cases, it is not possible to capture the defect into the region of the image size in which the defect image capturing coordinate is located at the visual field center.

Although the number of frames 803 depends on the electronic optical system conditions, it is necessary to increase the number in order to increase the S/N ratio. For example, in a case where the maximum value (defect detection) of a high reliability threshold is set to 100, the number of frames 803 changes the S/N ratio, and thus, the defect detection accuracy is correspondingly changed. However, in a case where the throughput is intended to be improved by reducing the imaging region, it is preferable to decrease a low reliability threshold 804 to some extent. However, if the low reliability threshold 804 is excessively decreased, the number of defect candidate points increases during the process in Step S63-3 in FIG. 5. Accordingly, it is assumed that the imaging region cannot be reduced since the imaging regions are adjacent to each other. In this regard, it is necessary to pay attention to the low reliability threshold 804.

Raster and vector scanning methods 806 employ a button disposed for selecting a scanning method by using a toggle button. Even though the button is used so as to select the scanning method, the scanning method may be automatically switched in accordance with the shape of the site detected as the region appearing as the defect.

In a case where the inspection information is not so inaccurate (in a case of satisfactory coordinate accuracy), increasing the reduction ratio leads to the improved throughput. As means for automatically selecting the scanning direction in accordance with the shape of the region appearing as the defect, an automatic toggle button 808 is provided. In a case where the automatic toggle button 808 is turned off, a button list 809 for selecting the scanning direction is activated so that the scanning direction can be selected. The scanning direction may be appropriately selected in accordance with a pattern formed on the sample to be inspected. Although only up and down and right and left arrows are displayed in the button list 809, as described above, an arrow may be additionally displayed in the oblique direction.

Hitherto, the embodiment, the application example, and the modification example according to the present invention have been described in detail with reference to the drawings. However, without being limited to the embodiment, the application example, and the modification example which are described above, the present invention can be modified in various ways, as a matter of course.

REFERENCE SIGNS LIST

10 DEFECT REVIEW SEM
11 PRIMARY ELECTRON BEAM
12 SECONDARY ELECTRON BEAM
20 SAMPLE
100 SEM MAIN BODY
110 COLUMN
120 SAMPLE ACCOMMODATION HOUSING
111 CHARGED PARTICLE SOURCE
112 ELECTRONIC OPTICAL SYSTEM
121 SAMPLE EXCHANGE CHAMBER
122 SAMPLE CHAMBER
123 SAMPLE STAGE
124 OPTICAL MICROSCOPE
113 EXTRACTION ELECTRODE
114 CONDENSER LENS
114-1 FIRST CONDENSER LENS
114-2 SECOND CONDENSER LENS
115 ALIGNMENT COIL
116 DEFLECTOR
117 OBJECTIVE LENS
118 SECONDARY ELECTRON DETECTOR
200 OBSERVATION CONTROL UNIT
201 MAIN BODY CONTROL UNIT
202 DISPLAY MONITOR
203 IMAGE DISPLAY UNIT
204 OPERATOR'S OPERATING MONITOR
205 EXTERNAL INTERFACE
211 APPARATUS CONTROL UNIT
212 ELECTRONIC OPTICAL SYSTEM CONTROL UNIT
213 CONVEYANCE CONTROL UNIT
214 STAGE CONTROL UNIT
215 IMAGE PROCESSING CONTROL UNIT
216 IMAGE CORRECTION CONTROL UNIT
217 IMAGE MEMORY
218 DEFECT DETECTION CONTROL UNIT
219 AUTOMATIC DEFECT CLASSIFICATION CONTROL UNIT
221 AMPLIFIER
222 HIGH VOLTAGE CONTROL UNIT
223 RETARDING VOLTAGE CONTROL UNIT
224 CONDENSER LENS CONTROL UNIT
224-1 FIRST CONDENSER LENS CONTROL UNIT
224-2 SECOND CONDENSER LENS CONTROL UNIT
225 ALIGNMENT CONTROL UNIT
226 DEFLECTION CURRENT CONTROL UNIT
227 OBJECTIVE LENS CONTROL UNIT

The invention claimed is:

1. A charged particle beam apparatus comprising:
a charged particle microscope that sequentially acquires the i-number of frames from a signal obtained by scanning a sample with a charged particle beam, and that acquires one image by adding the i-number of frames; and
an observation control unit that detects a defect on the sample by using the frames,
wherein each time the observation control unit acquires the i-number of frames, with i being a natural number equal to or greater than 1 in the same visual field, the observation control unit uses an added image of the frames acquired so far in the visual field, and performs a defect detection process of detecting the defect inside the visual field until the observation control unit completely acquires the subsequent i+1 number of frames in a visual field which is identical to or included in the visual field,
wherein the observation control unit repeatedly performs the defect detection process each time the i-number of frames is acquired,
wherein the observation control unit updates a coordinate of the defect which is obtained by acquiring the i-th frame immediately before and which is detected during the defect detection process, to a coordinate of the defect detected during the defect detection process using a newly acquired i+1-th frame, and
wherein the observation control unit completes the defect detection process in the visual field, if defect detection accuracy of the defect detected through the defect detection process exceeds a predetermined value.

2. The charged particle beam apparatus according to claim 1,
wherein the observation control unit determines a visual field size of the newly acquired i+1-th frame, based on defect detection accuracy detected during the defect detection process using the i-th frame.

3. The charged particle beam apparatus according to claim 1,
wherein the observation control unit determines a central coordinate of the subsequent newly acquired i+1-th frame, based on defect detection accuracy detected during the defect detection process using the i-th frame.

4. The charged particle beam apparatus according to claim 1,
wherein when the observation control unit completes the defect detection process in the visual field, the observation control unit adds and outputs all frames acquired in a region including the defect, as one image.

5. A charged particle beam apparatus comprising:
a charged particle microscope that sequentially acquires the i-number of frames from a signal obtained by scanning a sample with a charged particle beam, and that acquires one image by adding the i-number of frames; and
an observation control unit that detects a defect on the sample by using the frames,
wherein each time the observation control unit acquires the i-number of frames, with i being a natural number equal to or greater than 1 in the same visual field, the observation control unit uses an added image of the frames acquired so far in the visual field, and performs a defect detection process of detecting the defect inside the visual field until the observation control unit completely acquires the subsequent i+1 number of frames in a visual field which is identical to or included in the visual field,
wherein the observation control unit repeatedly performs the defect detection process each time the i-number of frames is acquired,
wherein the observation control unit updates a coordinate of the defect which is obtained by acquiring the i-th frame immediately before and which is detected during the defect detection process, to a coordinate of the defect detected during the defect detection process using a newly acquired i+1-th frame, and
wherein the charged particle microscope acquires the subsequent i-number of frames by scanning the sample with the charged particle beam in a direction different from a scanning direction of the charged particle beam when the frame used during the defect detection process immediately before is acquired.

6. A charged particle beam apparatus comprising:
a charged particle microscope configured to sequentially acquire a plurality of frames from signals obtained by scanning a sample with a charged particle beam, and acquire one image by adding the plurality of frames together; and
an observation control unit configured to detect a defect on the sample using the image obtained by adding the frames together, wherein the observation control unit is configured to
perform a defect detection process by generating a difference image between an added image of a plurality of (a maximum of n) frames acquired in the same visual field and a reference image corresponding to the visual field,
determine, if a defect candidate region is detected from a difference image between an added image of frames up to and including an i-th (i is a natural number equal to or greater than 1 and less than n) frame and the reference image, whether a defect candidate accuracy of the defect candidate region is greater than a threshold A, and reduce a region to be scanned with a charged particle beam by the charged particle microscope for a following (i+1)-th frame such that coordinates of the defect candidate region whose defect candidate accuracy has been determined to be greater than the threshold A are included, and integrate the frames up to and including (i+1)-th frame acquired with the reduced scanning region so as to generate an added image of the frames up to and including the (i+1)th frame, and
determine, if a defect candidate region is detected from a difference image between an added image of frames up to and including an n-th frame and the reference image, whether a defect candidate accuracy of the defect candidate region is greater than a threshold B that is more reliable than the threshold A, and reduce a region to be scanned with a charged particle beam by the charged particle microscope for a high magnification defect image of the defect candidate region such that coordinates of the defect candidate region whose defect candidate accuracy has been determined to be greater than the threshold B are included, and generate the high magnification defect image of the defect candidate region.

7. The charged particle beam apparatus according to claim 6,
wherein for the defect candidate region whose defect candidate accuracy has been determined to be greater than the threshold A, whether the defect candidate accuracy is greater than a predetermined threshold a is determined, and if the defect candidate accuracy is determined to be greater than the predetermined threshold a, a region to be scanned with a charged particle beam by the charged particle microscope for acquiring the following (i+1)-th frame is reduced such that coordinates of the defect candidate region whose defect candidate accuracy has been determined to be greater than the threshold A are included.

8. The charged particle beam apparatus according to claim 6,
wherein the observation control unit is configured to determine, on the basis of the coordinate positions of the defect candidate region whose defect candidate accuracy has been determined to be greater than the threshold A detected in the defect detection process for the i-th frame, determine the center coordinates of the following (i+1)-th frame.

9. The charged particle beam apparatus according to claim 6,
wherein the observation control unit is configured to determine whether the defect candidate accuracy of the defect candidate region that has been determined to be greater than the threshold A is greater than a predetermined threshold a, and, if the defect candidate accuracy of the defect candidate region is greater than the predetermined threshold a, reduce a region to be scanned with a charged particle beam by the charged particle microscope for acquiring the following (i+1)-th frame such that coordinates of the defect candidate region whose defect candidate accuracy has been determined to be greater than the threshold A are included, and determine whether the defect candidate accuracy of the defect candidate region that has been determined to be greater than the threshold B is greater than a predetermined threshold β, and, if the defect candidate accuracy of the defect candidate region is greater than the predetermined threshold β, reduce a region to be scanned with a charged particle beam by the charged particle microscope for acquiring a high magnification defect image of the defect candidate region whose defect candidate accuracy has been determined to be greater than the threshold B.

10. A defect observation method that uses a charged particle beam apparatus, the charged particle beam apparatus being configured to sequentially capture a plurality of images of a site appearing as a defect on a sample, and detect a genuine defect from one image obtained by adding the plurality of images together, the method comprising:

a step of generating a difference image between an added image of a plurality of (a maximum of n) frames acquired in the same visual field and a reference image corresponding to the visual field;

a step of determining, if a defect candidate region is detected from a difference image between an added image of frames up to and including an i-th (i is a natural number equal to or greater than 1 and less than n) frame and the reference image, whether a defect candidate accuracy of the defect candidate region is greater than a threshold A;

a step of, if the defect candidate accuracy of the defect candidate region is determined to be greater than the threshold A, reducing a region to be scanned with a charged particle beam by the charged particle microscope for a following (i+1)-th frame such that coordinates of the defect candidate region whose defect candidate accuracy has been determined to be greater than the threshold A are included, a step of integrating images of frames up to and including (i+1)-th frame acquired with the reduced scanning region so as to generate an added image of the frames up to and including the (i+1)th frame;

a step of determining, if a defect candidate region is detected from a difference image between an added image of frames up to and including an n-th frame and the reference image, whether a defect candidate accuracy of the defect candidate region is greater than a threshold B that is more reliable than the threshold A, and reducing a region to be scanned with a charged particle beam by the charged particle microscope for a high magnification defect image of the defect candidate region such that coordinates of the defect candidate region whose defect candidate accuracy has been determined to be greater than the threshold B are included; and a step of generating the high magnification defect image of the defect candidate region with the reduced scanning region.

* * * * *